United States Patent
Lee et al.

(10) Patent No.: US 8,854,239 B2
(45) Date of Patent: Oct. 7, 2014

(54) DATA PROCESSING APPARATUS AND METHOD

(71) Applicant: Institute For Information Industry, Taipei (TW)

(72) Inventors: Che-Rung Lee, Pingtung (TW); Hao-Ping Kang, Taipei (TW); Zhi-Hung Chen, Taichung (TW); Chi-Cheng Chuang, Kaohsiung (TW); Yu-Sheng Chiu, Kaohsiung (TW)

(73) Assignee: Institute For Information Industry, Taipei (TW)

( * ) Notice: Subject to any disclaimer, the term of this patent is extended or adjusted under 35 U.S.C. 154(b) by 0 days.

(21) Appl. No.: 13/769,340

(22) Filed: Feb. 17, 2013

(65) Prior Publication Data
US 2014/0145866 A1    May 29, 2014

(30) Foreign Application Priority Data
Nov. 26, 2012 (TW) ............... 101144128 A (51) Int. Cl.
*H03M 7/30* (2006.01)

(52) U.S. Cl.
CPC ..................... *H03M 7/30* (2013.01)
USPC .............................. 341/87; 341/55

(58) Field of Classification Search
CPC .......... H03M 7/30; H03M 7/60; H03M 7/607
USPC ............... 341/55, 67, 106, 107; 707/999.1, 707/999.101
See application file for complete search history.

(56) References Cited

U.S. PATENT DOCUMENTS

| | | | |
|---|---|---|---|
| 7,496,589 B1 * | 2/2009 | Jain et al. .............. | 1/1 |
| 7,552,130 B2 | 6/2009 | Cook et al. | |
| 7,558,290 B1 * | 7/2009 | Nucci et al. ............ | 370/477 |
| 7,590,641 B1 * | 9/2009 | Olson .................. | 1/1 |
| 7,868,789 B1 * | 1/2011 | Binnig et al. .......... | 341/51 |
| 7,884,737 B2 | 2/2011 | Zigdon et al. | |
| 7,966,343 B2 | 6/2011 | Yang et al. | |
| 8,115,660 B2 | 2/2012 | Kaufman et al. | |
| 2012/0029715 A1 | 2/2012 | Curt et al. | |

FOREIGN PATENT DOCUMENTS

TW     200925903 A    6/2009

* cited by examiner

*Primary Examiner* — Brian Young
(74) *Attorney, Agent, or Firm* — Skaar Ulbrich Macari, P.A.

(57) ABSTRACT

A data processing apparatus and a data processing method thereof are provided. The data processing apparatus includes a register and a processor electrically connected to the register. The register is stored with a plurality of data. The plurality of data each includes a first sub-datum and a second sub-datum. The plurality of first sub-data corresponds to a first column and the plurality of second sub-data corresponds to a second column. The processor compresses the first sub-data by a first compression algorithm according to a first characteristic of the plurality of first sub-data and compresses the second sub-data by a second compression algorithm according to a second characteristic of the plurality of second sub-data.

26 Claims, 9 Drawing Sheets

FIG. 1

| Time | Current value |
|---|---|
| 2012-8-7,23:01:25 | 3.4 |
| 2012-8-7,23:01:32 | 3.8 |
| 2012-8-7,23:01:39 | 3.5 |
| ⋮ | ⋮ |
| 2012-8-7,23:02:42 | 3.9 |

|   | ID code | Time | Current Value | Voltage Value |
|---|---------|------|---------------|---------------|
| 20a | 126 | 2012-8-7,23:01:25 | 3.4 | 110.1 |
|   | 126 | 2012-8-7,23:01:32 | 3.8 | 112.3 |
|   | ⋮ | ⋮ | ⋮ | ⋮ |
|   | 126 | 2012-8-7,23:02:42 | 3.9 | 114.4 |
| 20b | 514 | 2012-8-6,06:01:25 | 4.2 | 111.2 |
|   | ⋮ | ⋮ | ⋮ | ⋮ |
|   | 514 | 2012-8-6,09:23:45 | 5.4 | 110.5 |

FIG. 4A

| ID code | Time | Current Value | Voltage Value |
|---------|------|---------------|---------------|
| 126 | First compressed sub-datum | Second compressed sub-datum | Third compressed sub-datum |
| 514 | First compressed sub-datum | Second compressed sub-datum | Third compressed sub-datum |

| ID code | Minimum Value | Maximum Value | Time | Current Value | Voltage Value |
|---|---|---|---|---|---|
| 126 | 2012-8-7,23:01:25 | 2012-8-7,23:01:40 | First compressed sub-datum 44a | Second compressed sub-datum 64a | Third compressed sub-datum 74a |
| 126 | 2012-8-7,23:02:32 | 2012-8-7,23:02:42 | First compressed sub-datum 44b | Second compressed sub-datum 64b | Third compressed sub-datum 74b |
| 514 | 2012-8-6,06:01:25 | 2012-8-6,07:01:25 | First compressed sub-datum 44c | Second compressed sub-datum 64c | Third compressed sub-datum 74c |
| 514 | 2012-8-6,08:01:25 | 2012-8-6,08:30:45 | First compressed sub-datum 44d | Second compressed sub-datum 64d | Third compressed sub-datum 74d |
| 514 | 2012-8-6,09:01:25 | 2012-8-6,09:23:45 | First compressed sub-datum 44e | Second compressed sub-datum 64e | Third compressed sub-datum 74e |

DATA PROCESSING APPARATUS AND METHOD

PRIORITY

This application claims priority to Taiwan Patent Application No. 101144128 filed on Nov. 26, 2012, which is hereby incorporated herein by reference in its entirety.

FIELD

The present invention relates to a data processing apparatus and a data processing method. In particular, the present invention relates to a data processing apparatus and a data processing method capable of compressing/decompressing data according to characteristics of data columns.

BACKGROUND

The internet of Things (IoT) is a concept of connecting things to the Internet via various identifying and sensing devices so that remote control or direct object-to-object communication can be achieved for the purpose of intelligent identification management. Therefore, the sensing devices play a very important role in the IoT. As an example, sensing devices such as radio frequency identification (RFID) tags, infrared sensors, global positioning system (GPS) devices can be disposed on various objects (e.g., electric power grids, roads, buildings, household electric appliances, or the like) and connected with the Internet so that automatic identification and transparent management of the objects as well as information sharing can be achieved during the processes of production, distribution, and consumption of the objects. Hence, the IoT can be applied to various kinds of applications, including applications in transportation, logistics, intelligent environment management, health care, personal affairs, and so on.

What accompanied with the rapid development of the IoT is the generation of massive sensing data. The amount of the sensing data is still increasing with the time elapses. The massive sensing data occupy large memory spaces of hard disks and make the backup management difficult, so the data stored must be compressed at regularly to save the memory spaces of the hard disks.

The compression technology built in common databases (e.g., Oracle) may be used to compress the sensing data. Although this can reduce the memory spaces occupied in the hard disks, the compression technology built in the databases is not specifically used for compression of the sensing data. Consequently, the memory spaces that can be saved are limited. Furthermore, if a user wants to query only a part of the sensing data compressed by this kind of compression technology, he or she must decompress all the compressed sensing data, which makes the query time too long for the user.

Accordingly, an urgent need exists in the art to provide a technology that can solve the problems of a low data compression rate and a too long query time.

SUMMARY OF THE INVENTION

The primary objective of the present invention is to provide a data processing apparatus and a data processing method that can improve the compression rate of data (e.g., sensing data) and shorten the time necessary for querying the data. The data processing apparatus and the data processing method of the present invention can select an appropriate compression algorithm according to characteristics of sub-data corresponding to individual columns of the data. Furthermore, when the data to be compressed are from different apparatuses, the present invention can also assign different identification (ID) codes to the different apparatuses and then compress the data in groups. In this way, when a user uses a specific identification code for query, the present invention can decompress only all or a part of compressed sub-data corresponding to the identification code. Thereby, the present invention can effectively improve the data compression rate and provide a mechanism for quick querying to solve the problems with the prior art (i.e., the problems of a low compression rate of sensing data and a too slow speed of querying the sensing data).

To achieve the aforesaid objective, certain embodiments of the present invention provide a data processing apparatus, which comprises a register and a processor electrically connected to the register. The register is stored with a plurality of data, wherein each of the plurality of data comprises a first sub-datum and a second sub-datum. The plurality of first sub-data corresponds to a first column and the plurality of second sub-data corresponds to a second column. The processor is configured to compress the plurality of first sub-data by a first compression algorithm according to a first characteristic of the plurality of first sub-data and compress the plurality of second sub-data by a second compression algorithm according to a second characteristic of the plurality of second sub-data.

To achieve the aforesaid objective, certain embodiments of the present invention further disclose a data processing method. The data processing method is for use in an electronic apparatus. The electronic apparatus comprises a register and a processor, wherein the register has a plurality of data stored therein. Each of the data comprises a first sub-datum and a second sub-datum, the plurality of first sub-data corresponds to a first column, and the plurality of second sub-data corresponds to a second column. The data processing method comprises the following steps of: (a) enabling the processor to compress the plurality of first sub-data by a first compression algorithm according to a first characteristic of the plurality of first sub-data and (b) enabling the processor to compress the plurality of second sub-data by a second compression algorithm according to a second characteristic of the plurality of second sub-data.

The detailed technology and preferred embodiments implemented for the subject invention are described in the following paragraphs accompanying the appended drawings for people skilled in this field to well appreciate the features of the claimed invention. It is understood that the features mentioned hereinbefore and those to be commented on hereinafter may be used not only in the specified combinations, but also in other combinations or in isolation, without departing from the scope of the present invention.

DETAILED DESCRIPTION

The present invention can be explained with reference to the following example embodiments. However, these example embodiments are not intended to limit the present invention to any specific examples, embodiments, environments, applications or implementations described in these embodiments. Therefore, description of these embodiments is only for purpose of illustration rather than to limit the present invention. In the following embodiments and the attached drawings, elements not directly related to the present invention are omitted from depiction; and dimensional relationships among individual elements in the attached drawings are illustrated only for ease of understanding but not to limit the actual scale.

Figure 1:
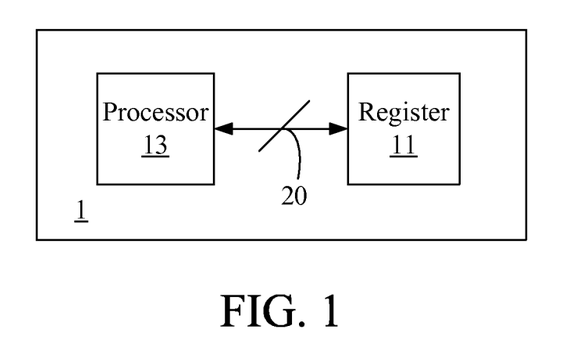
FIG. 1 depicts a schematic view of a data processing apparatus according to a first embodiment.
Figure 2:
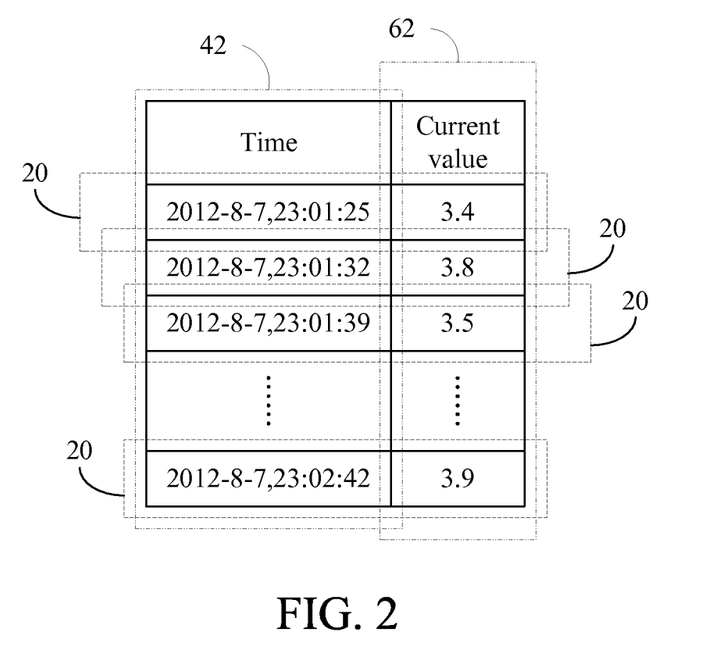
FIG. 2 depicts a schematic view of data stored in a register according to the first embodiment.

Refer to FIG. 1 and FIG. 2 for a first embodiment of the present invention. FIG. 1 depicts a data processing apparatus 1 of the first embodiment. The data processing apparatus 1 comprises a register 11 and a processor 13 electrically connected to the register 11. FIG. 2 depicts a plurality of data 20 stored in the register 11. As shown in FIG. 2, each of the data 20 comprises a first sub-datum and a second sub-datum, wherein the plurality of first sub-data corresponding to a first column 42 and the plurality of second sub-data corresponding to a second column 62. In this embodiment, the names of the first column 42 and the second column 62 are "time" and "current value" respectively.

In this embodiment, for each of the columns (i.e., the first column 42 and the second column 62), the processor 13 adopts an appropriate compression algorithm for compression according to a characteristic of the sub-data corresponding to the column. Specifically, the processor 13 compresses the plurality of first sub-data by a first compression algorithm according to a first characteristic of the plurality of first sub-data. Likewise, the processor 13 compresses the plurality of second sub-data by a second compression algorithm according to a second characteristic of the plurality of second sub-data.

If the characteristic of the sub-data corresponding to each of the columns is unknown by the processor 13 beforehand in other implementations, then the processor 13 will firstly determine the characteristic of the sub-data and then select an appropriate compression algorithm according to the determination result. For example, the processor 13 can firstly determine that the plurality of first sub-data has the first characteristic according to a first standard deviation of the plurality of first sub-data, and then determine to use the first compression algorithm according to the first characteristic. Likewise, the processor 13 can also firstly determine that the plurality of second sub-data has the second characteristic according to a second standard deviation of the plurality of second sub-data, and then determine to use the second compression algorithm according to the second characteristic. It shall be appreciated that the present invention does not limit the way of determining the characteristic of sub-data to a standard deviation of the sub-data. In other words, other approaches of determining the characteristic of the sub-data may be used as well.

To be more specific, if the first characteristic is that the values of the sub-data within each short time interval vary greatly (e.g., the first standard deviation of the sub-data is larger than a threshold value), then the processor 13 may select a dictionary compression algorithm as the first compression algorithm. If the first characteristic is that the values of the sub-data within a short time interval are relatively stable (e.g., the first standard deviation of the sub-data is smaller than a threshold value), then the processor 13 may select a shifting compression algorithm as the first compression algorithm. If the first characteristic is that values of the sub-data increase (or decrease) progressively, then the processor 13 may select an incremental compression algorithm as the first compression algorithm. The processor 13 also performs similar determination, selection, and processing on the second sub-data. It shall be appreciated that the aforesaid different compression algorithms and the correspondence relationships between the characteristics of the sub-data and the compression algorithms are only for purpose of illustration rather than to limit the present invention.

As can be known from the above descriptions, when the first characteristic of the first sub-data is different from the second characteristic of the second sub-data, the first compression algorithm and the second compression algorithm selected by the processor 13 are also different from each other. Since the processor 13 compresses the sub-data corresponding to each of the columns according to the characteristic of the sub-data corresponding to the column, an excellent compression effect can be achieved.

Figure 3:
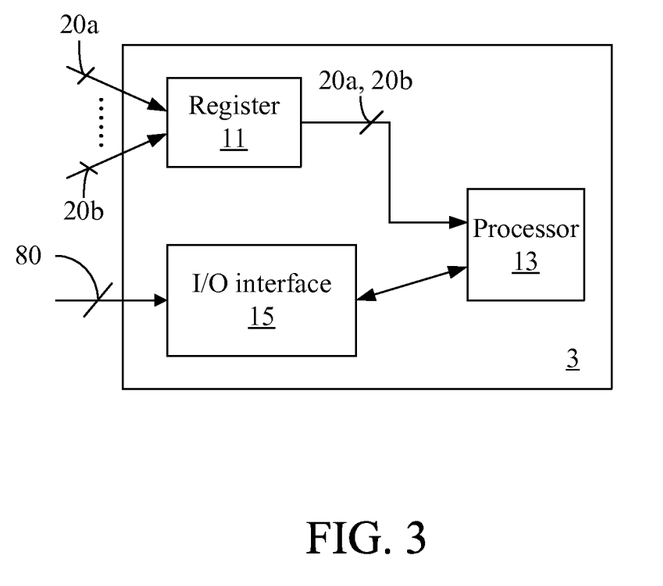
FIG. 3 depicts a schematic view of a data processing apparatus according to a second embodiment.
Figure 4A:
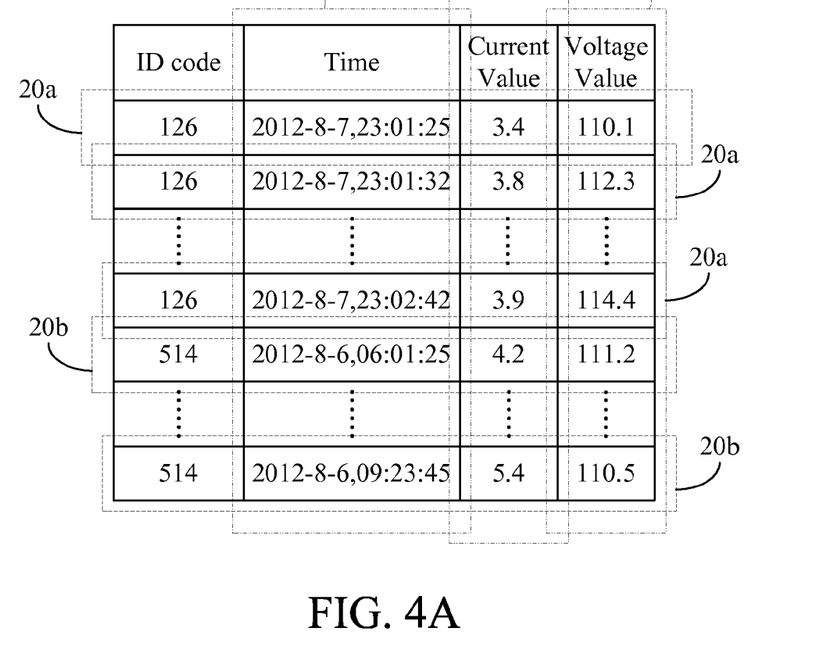
FIG. 4A depicts a schematic view of data stored in a register according to the second embodiment.
Figure 4B:
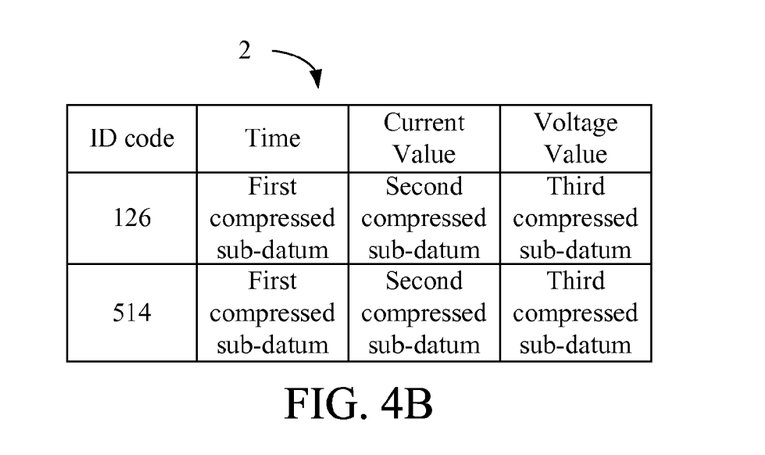
FIG. 4B depicts a schematic view of compressed data according to the second embodiment.

Refer to FIG. 3, FIG. 4A and FIG. 4B for a second embodiment of the present invention. FIG. 3 depicts a data processing apparatus 3 of this embodiment. The data processing apparatus 3 comprises a register 11, a processor 13, and an input/output (I/O) interface 15. The processor 13 is electrically connected to the register 11 and the I/O interface 15.

The register 11 stores a plurality of data 20a from a first apparatus and a plurality of data 20b from a second apparatus. The first apparatus has an identification code of 126, while the second apparatus has an identification code of 514. FIG. 4A depicts a schematic view of the data 20a, 20b. Each of the data 20a, 20b comprises an identification code, a first sub-datum, a second sub-datum, and a third sub-datum. The plurality of first sub-data corresponds to a first column 42, the plurality of second sub-data corresponds to a second column 62, and the plurality of third sub-data corresponds to a third column 72. In the second embodiment, the names of the first column 42, the second column 62 and the third column 72 are "time", "current value" and "voltage value" respectively.

Similar to the first embodiment, the processor 13 determines that the plurality of first sub-data has a first characteristic and determines a first compression algorithm according to the determination result. The processor 13 determines that the plurality of second sub-data has a second characteristic and determines a second compression algorithm according to the determination result. The processor 13 determines that the plurality of third sub-data has a third characteristic and determines a third compression algorithm according to the determination result.

In this embodiment, during subsequent compression of the sub-data, the processor 13 compresses those of the plurality of first sub-data that have a same identification code into a first compressed sub-datum respectively by the first compression algorithm. Likewise, the processor 13 compresses those of the plurality of second sub-data that have a same identification code into a second compressed sub-datum respectively by the second compression algorithm and compresses those of the plurality of third sub-data that have a same identification code into a third compressed sub-datum respectively by the third compression algorithm. In other words, after the compression, each of the identification codes corresponds to one of the first compressed sub-data, one of the second compressed sub-data, and one of the third compressed sub-data as shown by compressed data 2 in FIG. 4B. After the compression, the processor 13 can store the compressed data 2 into a database (not shown).

Next, if a user would like to inquire those of the data 20b with the identification code of 514 that correspond to the first column, then the user will input an inquiry message 80. The inquiry message 80 carries an inquiry code and the name of the first column. Specifically, the inquiry code has a value of 514 and the name of the column is "time value". After the inquiry message 80 is received by the I/O interface 15, the processor 13 decompresses the first compressed sub-datum of the compressed data 2 that has an identification code identical to the inquiry code (which has a value of 514) by a first decompression algorithm corresponding to the first compression algorithm.

Likewise, if the user would like to inquire those of the data 20a with the identification code of 126 that correspond to the first column and the second column, then the inquiry message 80 inputted by the user must carry an inquiry code and the names of the first column and the second column. Specifically, the inquiry code has a value of 126 and the names of the columns are "time value" and "current value". After the inquiry message 80 is received by the I/O interface 15, the processor 13 decompresses the first compressed sub-datum of the compressed data 2 that has an identification code identical to the inquiry code (which has a value of 126) by the first decompression algorithm corresponding to the first compression algorithm. Furthermore, the processor 13 also decompresses the second compressed sub-datum of the compressed data 2 that has an identification code identical to the inquiry code (which has a value of 126) by a second decompression algorithm corresponding to the second compression algorithm.

As can be known from the above descriptions, the user can inquire a specific column corresponding to a specific identification code through the mechanism provided in the second embodiment. By inputting an inquiry code identical to the specific identification code and a name of the specific column, the processor 13 only needs to decompress a compressed sub-datum that corresponds to the column and that has an identification code identical to the inquiry code. In other words, the processor 13 will not decompress sub-data corresponding to the columns which are not inquired by the user, so the decompression time can be shortened.

In addition to the aforesaid operations, the data processing apparatus 3 of this embodiment can also execute all the operations of the data processing apparatus 1 of the first embodiment and accomplish all the corresponding functions. How the data processing apparatus 3 of this embodiment executes these operations and accomplishes these functions can be readily appreciated by those of ordinary skill in the art based on the explanation of the first embodiment, and thus will not be further described herein.

Figure 5:
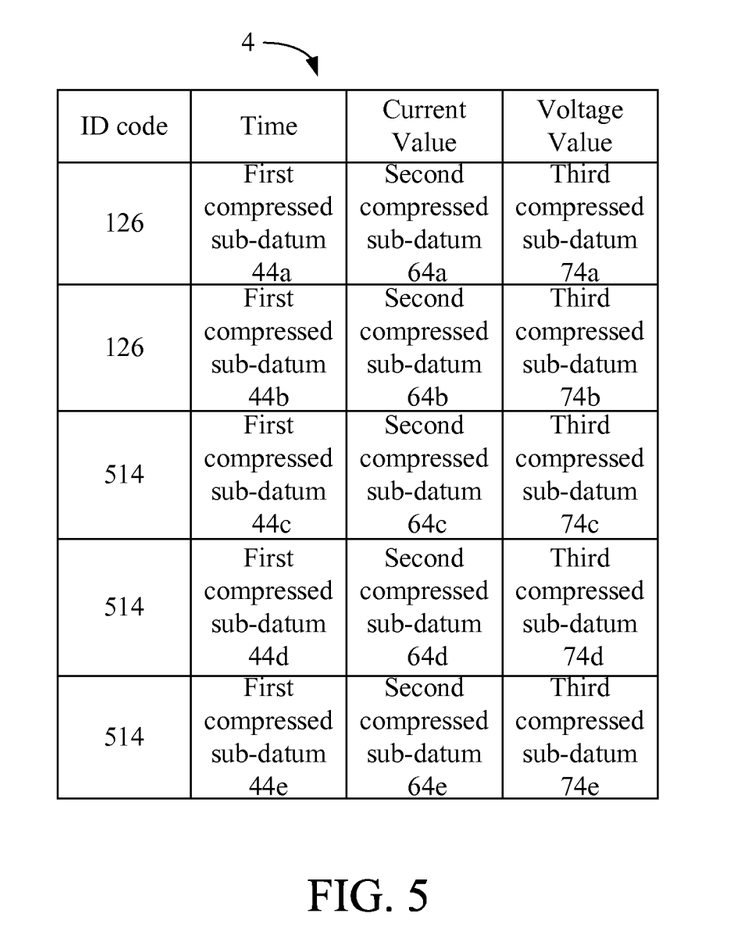
FIG. 5 depicts a schematic view of compressed data according to a third embodiment.

Refer to FIG. 3, FIG. 4A, and FIG. 5 for a third embodiment of the present invention. Operations that can be executed by the register 11, the processor 13 and the I/O interface 15 in the third embodiment are the same as those in the second embodiment, so only differences between the two embodiments will be detailed hereinafter.

In this embodiment, the processor 13 firstly divides those of the plurality of data that have the same identification code into a plurality of groups before compressing the sub-data corresponding to each of the identification codes. Specifically, the processor 13 can group the data with each group having a fixed number of data; e.g., every 10 data form a group. Then, for each of the groups having the same identification code, the processor 13 compresses all the first sub-data of the group into a first compressed sub-datum by the first compression algorithm, compresses all the second sub-data of the group into a second compressed sub-datum by the second compression algorithm, and compresses all the third sub-data of the group into a third compressed sub-datum by the third compression algorithm.

If the data 20a, 20b shown in FIG. 4A are compressed by the compression mechanism of this embodiment, then compressed data 4 as shown in FIG. 5 are obtained. The identification code of 126 corresponds to two compressed data in total. Specifically, a first compressed datum comprises the identification code, a first compressed sub-datum 44a, a second compressed sub-datum 64a, and a third compressed sub-datum 74a, while a second compressed datum comprises the identification code, a first compressed sub-datum 44b, a second compressed sub-datum 64b, and a third compressed sub-datum 74b. The identification code of 514 corresponds to three compressed data in total. Specifically, a first compressed datum comprises the identification code, a first compressed sub-datum 44c, a second compressed sub-datum 64c, and a third compressed sub-datum 74c, a second compressed datum comprises the identification code, a first compressed sub-datum 44d, a second compressed sub-datum 64d, and a third compressed sub-datum 74d, and a third compressed datum comprises the identification code, a first compressed sub-datum 44e, a second compressed sub-datum 64e, and a third compressed sub-datum 74e.

In addition to the inquiry mechanism of the second embodiment, the third embodiment also provides another inquiry mechanism. Specifically, the additional inquiry mechanism of this embodiment allows the user to set an inquiry range of a specific column. In this case, the inquiry message 80 received by the I/O interface 15 further carries an inquiry range in addition to the inquiry code and the names of the specific columns (e.g., the first column, the second column or/and the third column) and the inquiry range corresponds to a specific one of the columns.

Hereinafter, descriptions will be made with the contents depicted in FIG. 4A and FIG. 5 as an example. If the user would like to inquire current values within a specific time range that correspond to the identification code of 514, then the inquiry message 80 must carry the inquiry code (which has a value of 514), the names (i.e., "time" and "current value") of the first column and the second column, and an inquiry range (i.e., a time range) corresponding to the first column. Then, the processor 13 decompresses each of the first compressed sub-data 44c, 44d, 44e that has an identification code identical to the inquiry code into a plurality of first decompressed sub-data by the first decompression algorithm and decompresses each of the second compressed sub-data 64c, 64d, 64e that has an identification code identical to the inquiry code into a plurality of second decompressed sub-data by the second decompression algorithm. Subsequently, the processor 13 selects those of the first decompressed sub-data that lie within the time range and the corresponding second decompressed sub-data. Then, the selected sub-data can be transmitted by the I/O interface 15 to the user.

If the data 20a, 20b depicted in FIG. 4A have been sorted (e.g., sorted incrementally according to the time values for each of the identification codes), then the processor 13 can respond to the inquiry of the user more efficiently by another decompression mechanism. Specifically, the processor 13 can firstly decompress any one of the first compressed sub-data 44c, 44d, 44e and then compare the plurality of first decompressed sub-data obtained through decompression with the inquiry range in order to determine whether this first compressed sub-datum is needed and which one of the first compressed sub-data shall be processed subsequently. For example, if the processor 13 firstly decompresses the first compressed sub-datum 44*d* and determines that the time values of the plurality of first decompressed sub-data obtained through decompression are all smaller than a lower limit of the inquiry range, then the processor 13 will decompress the first compressed sub-datum 44*e* directly without processing the first compressed sub-datum 44*c* so as to reduce the search time. After determining which one of the first compressed sub-data is needed, the processor 13 will decompress the corresponding second compressed sub-datum.

As can be known from the above descriptions, when the number of the data 20*a*, 20*b* is large, the mechanism of the third embodiment firstly groups the data 20*a*, 20*b* before compressing them. Furthermore, the user inquiring the data can obtain the inquiry result efficiently by inputting an inquiry range.

Figure 6:
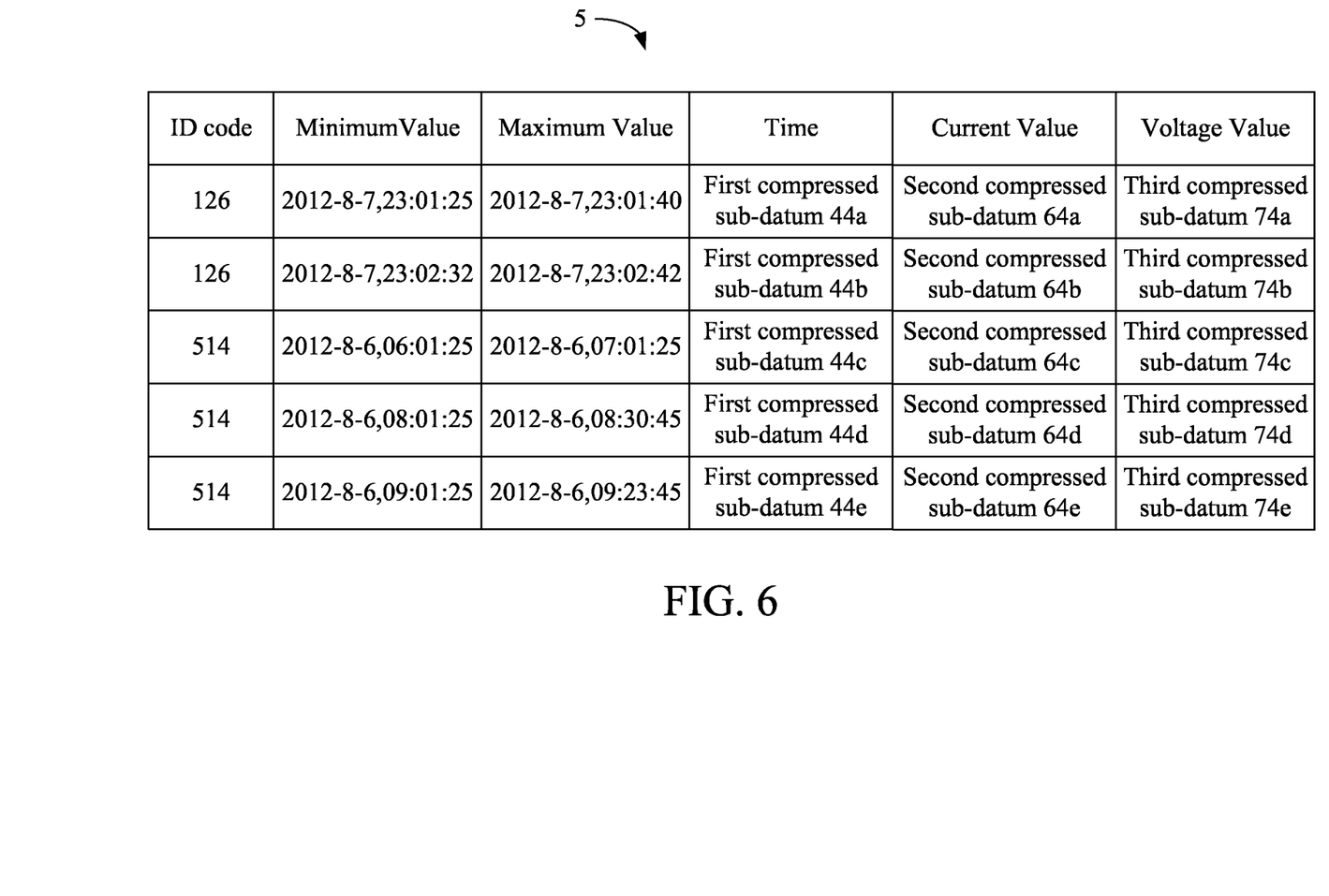
FIG. 6 depicts a schematic view of compressed data according to a fourth embodiment.

Refer to FIG. 3, FIG. 4A, and FIG. 6 for a fourth embodiment of the present invention. Operations that can be executed by the register 11, the processor 13, and the I/O interface 15 in the fourth embodiment are the same as those in the third embodiment, so only differences between the two embodiments will be detailed hereinafter.

In addition to compressing the sub-data through the compression mechanism of the third embodiment, the processor 13 in this embodiment further records a minimum value and a maximum value of the sub-data in each of the groups corresponding to a specific column (e.g., a minimum value and a maximum value of all the first sub-data in the group corresponding to the first column). The compressed data 5 obtained through compression in this embodiment are as shown in FIG. 6. Since each of the groups has recorded therein a minimum value and a maximum value corresponding to a specific column, it may be considered that the minimum value and the maximum value of each of the groups define a data range. When the user inquires the data subsequently, the processor 13 will store the minimum value and the maximum value of each of the groups into the register 11 for use in initial comparison.

In this embodiment, the inquiry message 80 received by the I/O interface 15 also carries an inquiry code, a name of a specific column (e.g., the first column), and an inquiry range corresponding to the specific column. For each of the first compressed sub-data that has an identification code identical to the inquiry code, the processor 13 firstly selects a group of which the data range overlaps with the inquiry range and then decompresses a compressed sub-datum corresponding to a specific column by an appropriate decompression algorithm.

Hereinafter, descriptions will be made with the contents depicted in FIG. 4A and FIG. 6 as an example. If the user is to inquire current values within a specific time range (e.g., from 8:10 a.m. on Aug. 6, 2012 to 9:15 a.m. on Aug. 6, 2012) that correspond to the identification code of 514, then the inquiry message 80 must carry the inquiry code (which has a value of 514), the names (i.e., "time" and "current value") of the first column and the second column, and an inquiry range (i.e., the aforesaid time range).

Then, for each of the groups with the identification code of 514, the processor 13 determines whether the data range defined by the minimum value and the maximum value overlaps with the inquiry range and selects those of the groups whose data ranges overlap with the inquiry range. Then, for each of the selected groups, the processor 13 decompresses the first compressed sub-datum by the first decompression algorithm and decompresses the second compressed sub-datum by the second decompression algorithm. Continuing with the aforesaid example, the processor 13 only selects the last two groups with the identification code of 514 and then decompresses the first compressed sub-data 44*d*, 44*e* and the second compressed sub-data 64*d*, 64*e*.

In this embodiment, each of the compressed groups stores the maximum value and the minimum value corresponding to a specific column. Therefore, when the user inquires the data, the processor 13 may firstly determine whether the inquiry range overlaps with the data range defined by the maximum value and the minimum value of each of the groups and then determine which compressed sub-data are to be decompressed. Thereby, this embodiment can significantly reduce the decompression and search time.

Figure 7A:
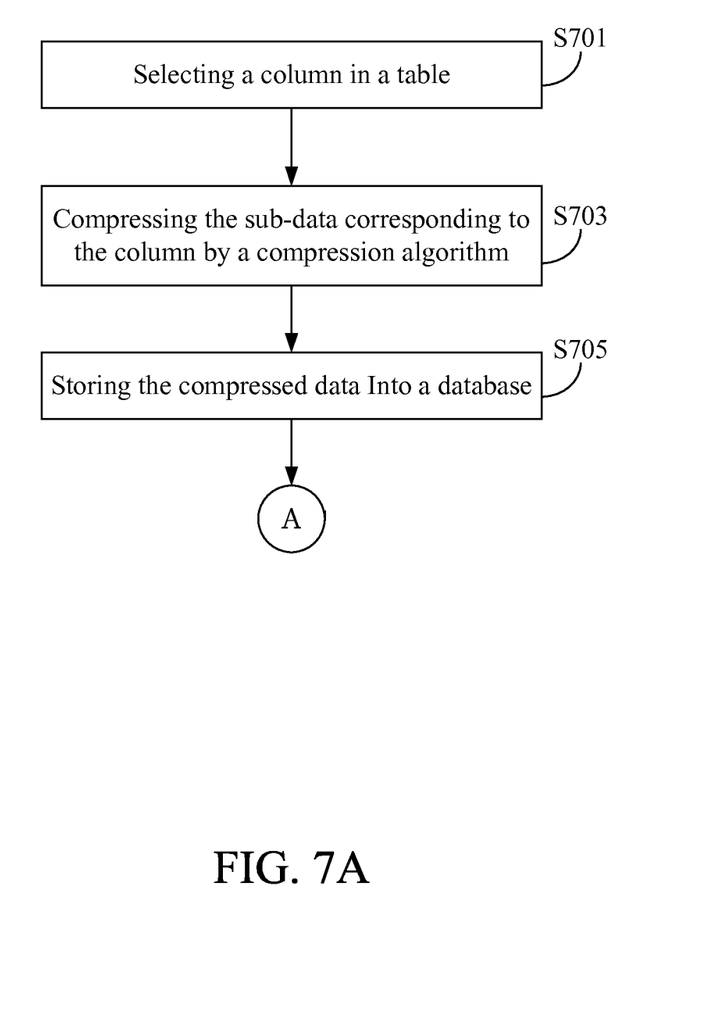
FIG. 7A and FIG. 7B depict flowchart diagrams of a fifth embodiment.
Figure 7B:
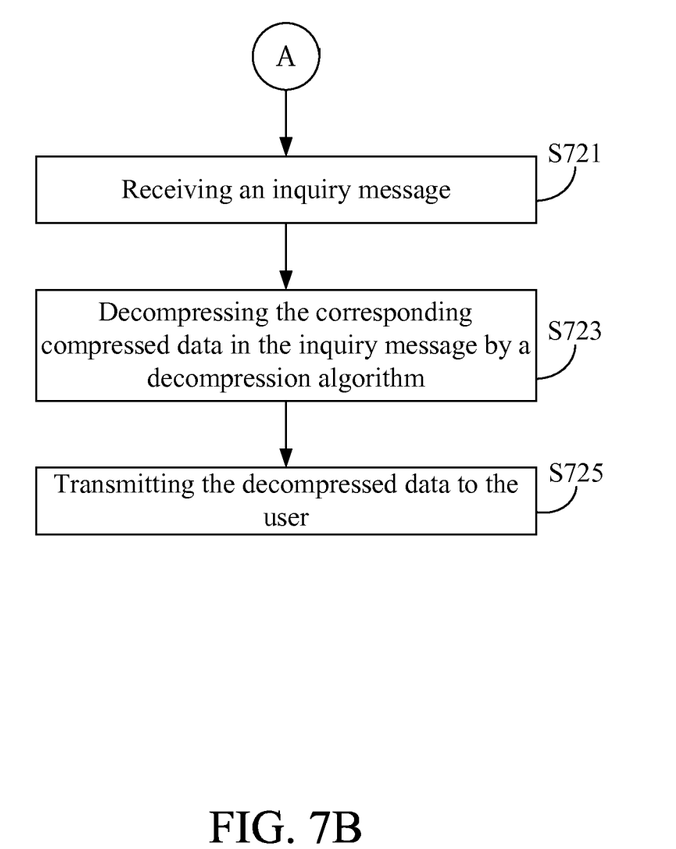

A fifth embodiment of the present invention is a data processing method, the flowchart diagrams of which are depicted in FIG. 7A and FIG. 7B. The data processing method of this embodiment is for use in an electronic apparatus, which comprises a register, a processor, and an I/O interface. The processor is electrically connected to the register and the I/O interface and the electronic apparatus may be the aforesaid data processing apparatus 1 or 3. The register of the electronic apparatus has a table stored therein and the table comprises a plurality of data. Each of the data comprises at least one sub-datum, which corresponds to a column of the table.

Firstly, step S701 is executed by the processor to select a column in the table. Then, step S703 is executed by the processor to compress the sub-data corresponding to the column by a compression algorithm. It shall be appreciated that the compression algorithm used by the processor in the step S703 is determined according to a characteristic of the sub-data corresponding to the column. If the table has a plurality of columns, then the data processing method of this embodiment will execute the step S703 repeatedly until the sub-data corresponding to all the columns are compressed. Thereafter, step S705 is executed by the I/O interface to transmit the compressed data to a database for storage.

After the table is compressed into the compressed data by the data processing method, the data can be inquired by the user. Then, step S721 is executed by the I/O interface to receive an inquiry message. The inquiry message carries a name of at least one column of the table. Then, step S723 is executed by the processor to decompress the corresponding sub-data in the inquiry message by a decompression algorithm. The decompression algorithm corresponds to the compression algorithm previously used to compress the sub-data corresponding to the column. After the inquired sub-data corresponding to the at least one column are all decompressed, then step S725 is executed by the I/O interface to transmit the decompressed data to the user.

In addition to the aforesaid steps, the data processing method of this embodiment can also execute all the operations set forth in the first embodiment and accomplish all the corresponding functions. How the data processing method of this embodiment executes these operations and accomplishes these functions can be readily appreciated by those of ordinary skill in the art based on the explanation of the first embodiment, and thus will not be further described herein.

Figure 8A:
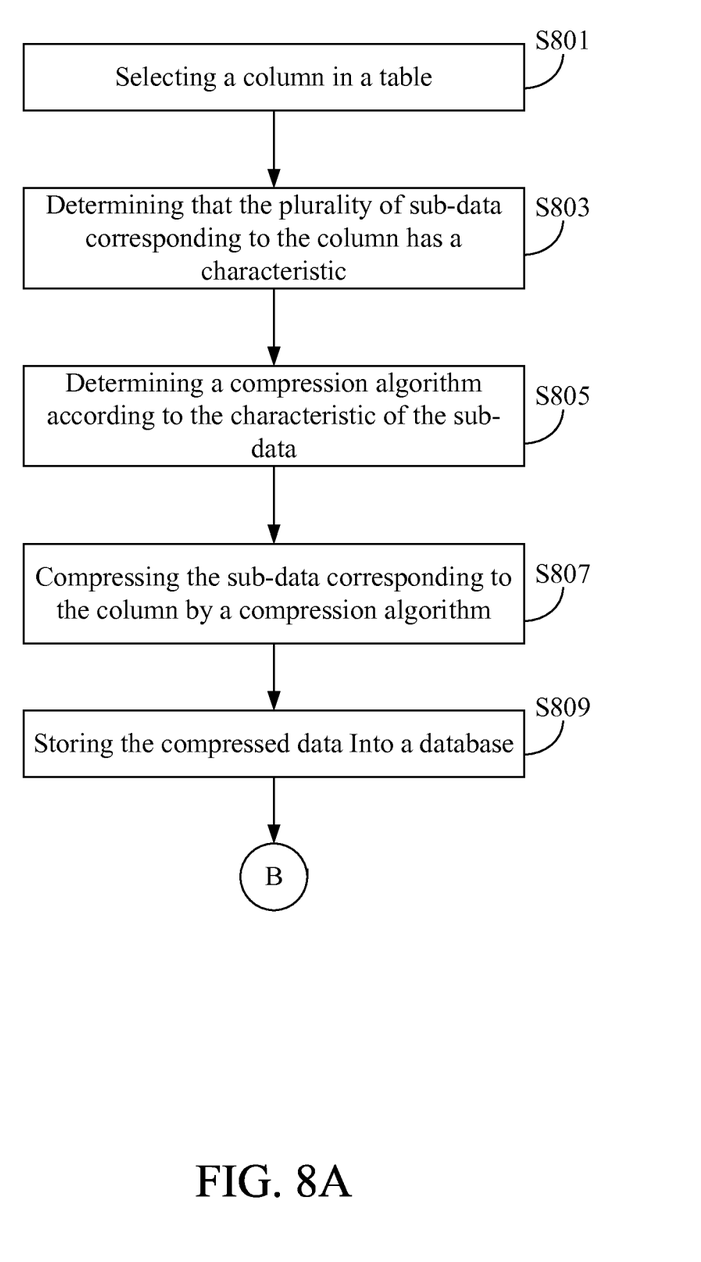
FIG. 8A and FIG. 8B depict flowchart diagrams of a sixth embodiment.
Figure 8B:
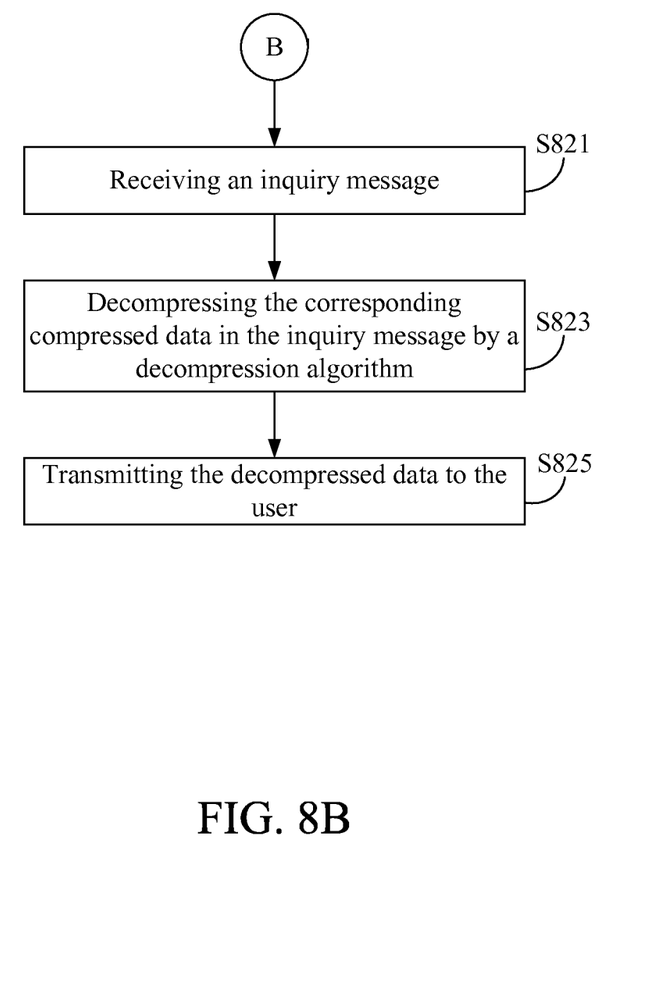

A sixth embodiment of the present invention is a data processing method, the flowchart diagrams of which are depicted in FIG. 8A and FIG. 8B. The data processing method of this embodiment is for use in an electronic apparatus, which comprises a register, a processor, and an I/O interface. The processor is electrically connected to the register and the I/O interface and the electronic apparatus may be the aforesaid data processing apparatus 1 or 3. The register of the electronic apparatus has a table stored therein and the table comprises a plurality of data. Each of the data comprises at least one sub-datum, which corresponds to a column.

Firstly, step S801 is executed by the processor to select a column in the table. Then, step S803 is executed by the processor to determine a characteristic of the plurality of sub-data corresponding to the column. For example, step S803 may be executed to determine a characteristic of the plurality of sub-data according to a standard deviation of the plurality of sub-data. Subsequently, step S805 is executed by the processor to determine a compression algorithm according to the characteristic determined in the step S803. Then, step S807 is executed by the processor to compress the sub-data corresponding to the column by the compression algorithm determined in the step S805. If the table has a plurality of columns, then the data processing method of this embodiment will execute the step S801 to the step S807 repeatedly until the sub-data corresponding to all the columns are compressed.

After the sub-data corresponding to all the columns are processed by the processor, step S809 is executed to enable the I/O interface to transmit the compressed data to a database for storage. Through the aforesaid steps, the data processing method will compress the sub-data corresponding to different columns by different compression algorithms when the sub-data corresponding to the different columns have different characteristics.

It shall be appreciated that how the data processing method of this embodiment determines the characteristics of the sub-data, the correspondence relationships between the characteristics of the sub-data and the compression algorithms, and which compression algorithms can be used are the same as those described in the aforesaid embodiments and, thus, will not be further described herein. Furthermore, if the characteristic of the sub-data corresponding to each of the columns has been known beforehand in other implementations, then the step S803 can be omitted. Moreover, if the correspondence relationships between the characteristics of the sub-data and the compression algorithms have been determined in advance in other implementations, then the step S803 and the step S805 can be omitted.

After the table is compressed into the compressed data by the data processing method, the data can be inquired by the user. Then, step S821 is executed by the I/O interface to receive an inquiry message. The inquiry message carries a name of at least one column of the table. Then, step S823 is executed by the processor to decompress the corresponding sub-data in the inquiry message by a decompression algorithm. The decompression algorithm corresponds to the compression algorithm previously used to compress the sub-data corresponding to the column. After the inquired sub-data corresponding to the at least one column are all decompressed, then step S825 is executed by the I/O interface to transmit the decompressed data to the user.

It shall be appreciated that if each of the data comprised in the table further comprises an identification code in other embodiments, then in the step S807, the processor compresses those of the sub-data corresponding to the column that have a same identification code into a compressed sub-datum respectively by the compression algorithm determined in the step S805. In this case, the inquiry message further carries an inquiry code in addition to the name of the at least one column. Therefore, in the inquiry process, step S823 is executed by the processor to decompress one of the compressed sub-data corresponding to the column that has an identification code identical to the inquiry code by the decompression algorithm.

Further, if each of the data comprised in the table comprises an identification code, the data processing method of the present invention provides another implementation. After the step S805 is executed, another step (not shown) of the data processing method is executed to enable the processor to divide those of the plurality of data that have a same identification code into a plurality of groups. Then, step S807 is executed by the processor to compress the sub-data of the groups corresponding to the column into a compressed sub-datum respectively by the compression algorithm determined in the step S805. In this case, the inquiry message further carries an inquiry range in addition to an inquiry code and the name of the at least one column. In this case, when the step S823 of the data processing method is executed for the first time, the processor decompresses each of the compressed sub-data corresponding to the column and having an identification code identical to the inquiry code by a decompression algorithm so as to obtain a plurality of decompressed sub-data. Then, the data processing method is executed to select those of the decompressed sub-data that lie within the inquiry range. When the step S823 of the data processing method is executed again to process the sub-data corresponding to other columns, the processor decompresses, for the decompressed sub-data selected when the step S823 is executed for the first time, each of the compressed sub-data corresponding to the other columns.

Further, on the basis of the above descriptions, the step S807 of the data processing method in other embodiments may further enable the processor to record a minimum value and a maximum value of the sub-data, which correspond to a specific column, in each of the groups. The minimum value and the maximum value of each of the groups define a data range. In this case, when the step S823 of the data processing method is executed for the first time, the processor selects, for the compressed sub-data that have an identification code identical to the inquiry code, a group of which the data range overlaps with the inquiry range and decompresses the compressed sub-datum of the selected group corresponding to the column. When the step S823 of the data processing method is executed again to process the sub-data corresponding to other columns, the processor decompresses, for the group selected when the step S823 is executed for the first time, the compressed sub-data corresponding to the other columns.

In addition to the aforesaid steps, the data processing method of this embodiment can also execute all the operations set forth in the first embodiment to the fifth embodiment and accomplish all the corresponding functions. How the data processing method of this embodiment executes these operations and accomplishes these functions can be readily appreciated by those of ordinary skill in the art based on the explanation of the first embodiment to the fifth embodiment, and thus will not be further described herein.

According to the above descriptions, the data processing apparatus and the data processing method thereof of the present invention can select an appropriate compression algorithm according to characteristics of sub-data corresponding to different columns in the table, so a good compression effect can be achieved. Furthermore, when the data to be compressed are from different apparatuses, the present invention can also assign different identification codes to the different apparatuses and then compress the data in groups. In this way, when the user uses a specific identification code for query, the present invention can decompress only all or a part of compressed sub-data corresponding to the identification code. Thereby, the present invention can effectively improve the data compression rate and provide a mechanism for quick querying to solve the problems with the prior art (i.e., the problems of a low compression rate of sensing data and a too slow speed of querying the sensing data).

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A data processing apparatus, comprising:
a register, being configured to store a plurality of data, each of the data comprises a first sub-datum and a second sub-datum, the plurality of first sub-data corresponding to a first column, and the plurality of second sub-data corresponding to a second column, each of the plurality of data further comprising an identification code; and
a processor electrically connected to the register, being configured to compress those of the plurality of first sub-data that have a same identification code into a first compressed sub-datum individually by a first compression algorithm according to a first characteristic of the plurality of first sub-data and compress those of the plurality of second sub-data that have a same identification code into a second compressed sub-datum individually by a second compression algorithm according to a second characteristic of the plurality of second sub-data.

2. The data processing apparatus as claimed in claim 1, further comprising:
an input/output interface, being configured to receive an inquiry message, the inquiry message carrying an inquiry code and a name of the first column;
wherein the processor is further configured to decompress one of the first compressed sub-data that has an identification code identical to the inquiry code by a first decompression algorithm, wherein the first decompression algorithm corresponds to the first compression algorithm.

3. The data processing apparatus as claimed in claim 2, wherein the inquiry message further carries a name of the second column, the processor is further configured to decompress one of the second compressed sub-data that has an identification code identical to the inquiry code by a second decompression algorithm, and the second decompression algorithm corresponds to the second compression algorithm.

4. A data processing apparatus, comprising:
a register, being configured to store a plurality of data, each of the data comprises a first sub-datum and a second sub-datum, the plurality of first sub-data corresponding to a first column, and the plurality of second sub-data corresponding to a second column, each of the plurality of data further comprising an identification code; and
a processor electrically connected to the register, being configured to divide those of the plurality of data that have a same identification code into a plurality of groups, compress the first sub-data of the group into a first compressed sub-datum by a first compression algorithm according to a first characteristic of the plurality of first sub-data and compress the second sub-data of the group into a second compressed sub-datum by a second compression algorithm according to a second characteristic of the plurality of second sub-data.

5. The data processing apparatus as claimed in claim 4, further comprising:

an input/output interface, being configured to receive an inquiry message, the inquiry message carrying an inquiry code, a name of the first column, and an inquiry range;
wherein the processor is further configured to decompress each of the plurality of first compressed sub-data that has the identification code identical to the inquiry code into a plurality of first decompressed sub-data by a first decompression algorithm and select those of the plurality of first decompressed sub-data that lie within the inquiry range, wherein the first decompression algorithm corresponds to the first compression algorithm.

6. The data processing apparatus as claimed in claim 5, wherein the inquiry message further carries a name of the second column, the processor is further configured to decompress each of the plurality of second compressed sub-data which has the identification code identical to the inquiry code into a plurality of second decompressed sub-data by a second decompression algorithm and select those of the plurality of second decompressed sub-data that lie within the inquiry range, wherein the second decompression algorithm corresponds to the second compression algorithm.

7. The data processing apparatus as claimed in claim 4, wherein the processor further records a minimum value and a maximum value of the first sub-data in each of the groups.

8. The data processing apparatus as claimed in claim 7, wherein the minimum value and the maximum value of each of the groups define a data range, the data processing apparatus further comprising:
an input/output interface, being configured to receive an inquiry message, the inquiry message carrying an inquiry code, a name of the first column, and an inquiry range;
wherein the processor further performs the following operations on each of the first compressed sub-data that has an identification code identical to the inquiry code:
selecting a group of which the data range overlaps with the inquiry range, and
decompressing the first compressed sub-datum of the selected group into a plurality of first decompressed sub-data by a first decompression algorithm, wherein the first decompression algorithm corresponds to the first compression algorithm.

9. The data processing apparatus as claimed in claim 8, wherein the inquiry message further carries a name of the second column, the processor is further configured to decompress the second compressed sub-datum of the selected group into a plurality of second decompressed sub-data by a second decompression algorithm, and the second decompression algorithm corresponds to the second compression algorithm.

10. A data processing apparatus, comprising:
a register, being configured to store a plurality of data, each of the data comprises a first sub-datum and a second sub-datum, the plurality of first sub-data corresponding to a first column, and the plurality of second sub-data corresponding to a second column; and
a processor electrically connected to the register, being configured to determine that the plurality of first sub-data has a first characteristic according to a first standard deviation of the plurality of first sub-data, determine a first compression algorithm according to the first characteristic, compress the plurality of first sub-data by the first compression algorithm, determine that the plurality of second sub-data has a second characteristic according to a second standard deviation of the plurality of second sub-data, and determine a second compression algorithm according to the second characteristic, and compress the plurality of second sub-data by the second compression algorithm.

11. A data processing method for use in an electronic apparatus, the electronic apparatus comprising a register and a processor, the register being stored with a plurality of data, each of the data comprising a first sub-datum and a second sub-datum, the plurality of first sub-data corresponding to a first column, the plurality of second sub-data corresponding to a second column, each of the plurality of data further comprising an identification code, and the data processing method comprising the following steps of:

compressing, by the processor, those of the plurality of first sub-data that have a same identification code into a first compressed sub-datum respectively by a first compression algorithm according to a first characteristic of the plurality of first sub-data; and compressing, by the processor, those of the plurality of second sub-data that have a same identification code into a second compressed sub-datum respectively by a second compression algorithm according to a second characteristic of the plurality of second sub-data.

12. The data processing method as claimed in claim 11, wherein the electronic apparatus further comprises an input/output interface and the data processing method further comprises the following steps of:

receiving, by the input/output interface, an inquiry message, the inquiry message carrying an inquiry code and a name of the first column; and decompressing, by the processor, one of the first compressed sub-data that has an identification code identical to the inquiry code by a first decompression algorithm;

wherein the first decompression algorithm corresponds to the first compression algorithm.

13. The data processing method as claimed in claim 12, wherein the inquiry message further carries a name of the second column and the data processing method further comprises the following step of:

decompressing, by the processor, one of the second compressed sub-data that has an identification code identical to the inquiry code by a second decompression algorithm;

wherein the second decompression algorithm corresponds to the second compression algorithm.

14. A data processing method for use in an electronic apparatus, the electronic apparatus comprising a register and a processor, the register being stored with a plurality of data, each of the data comprising a first sub-datum and a second sub-datum, the plurality of first sub-data corresponding to a first column, the plurality of second sub-data corresponding to a second column, each of the plurality of data further comprises an identification code, and the data processing method comprising the following steps of:

dividing, by the processor, those of the plurality of data that have a same identification code into a plurality of groups;

compressing, by the processor, the first sub-data of the group into a first compressed sub-datum by a first compression algorithm according to a first characteristic of the plurality of first sub-data; and compressing, by the processor, the plurality of second sub-data of the group into a second compressed sub-datum by a second compression algorithm according to a second characteristic of the plurality of second sub-data.

15. The data processing method as claimed in claim 14, wherein the electronic apparatus further comprises an input/output interface and the data processing method further comprises the following steps of:

receiving, by the input/output interface, an inquiry message, the inquiry message carrying an inquiry code, a name of the first column, and an inquiry range;

decompressing, by the processor, each of the plurality of first compressed sub-data that has the identification code identical to the inquiry code into a plurality of first decompressed sub-data by a first decompression algorithm; and selecting, by the processor, those of the plurality of first decompressed sub-data that lie within the inquiry range;

wherein the first decompression algorithm corresponds to the first compression algorithm.

16. The data processing method as claimed in claim 15, wherein the inquiry message further carries a name of the second column and the data processing method further comprises the following steps of:

decompressing, by the processor, each of the plurality of second compressed sub-data which has the identification code identical to the inquiry code into a plurality of second decompressed sub-data by a second decompression algorithm; and selecting, by the processor, those of the plurality of second decompressed sub-data that lie within the inquiry range;

wherein the second decompression algorithm corresponds to the second compression algorithm.

17. The data processing method as claimed in claim 14, further comprising the following step of:

recording, by the processor, a minimum value and a maximum value of the first sub-data in each of the groups.

18. The data processing method as claimed in claim 14, wherein the electronic apparatus further comprises an input/output interface, the minimum value and the maximum value of each of the groups define a data range, and the data processing method further comprises the following steps of:

receiving, by the input/output interface, an inquiry message, the inquiry message carrying an inquiry code, a name of the first column, and an inquiry range; and performing, by the processor, the following operations on each of the first compressed sub-data that has an identification code identical to the inquiry code:

selecting a group of which the data range overlaps with the inquiry range; and decompressing the first compressed sub-datum of the selected group into a plurality of first decompressed sub-data by a first decompression algorithm;

wherein the first decompression algorithm corresponds to the first compression algorithm.

19. The data processing method as claimed in claim 18, wherein the inquiry message further carries a name of the second column and the data processing method further comprises the following step of:

decompressing, by the processor, the second compressed sub-datum of the selected group into a plurality of second decompressed sub-data by a second decompression algorithm;

wherein the second decompression algorithm corresponds to the second compression algorithm.

20. A data processing method for use in an electronic apparatus, the electronic apparatus comprising a register and a processor, the register being stored with a plurality of data, each of the data comprising a first sub-datum and a second sub-datum, the plurality of first sub-data corresponding to a first column, the plurality of second sub-data corresponding to a second column, and the data processing method comprising the following steps of:
- determining, by the processor, that the plurality of first sub-data has a first characteristic according to a first standard deviation of the plurality of first sub-data;
- determining, by the processor, a first compression algorithm according to the first characteristic;
- compressing, by the processor, the plurality of first sub-data by the first compression algorithm;
- determining, by the processor, that the plurality of second sub-data has a second characteristic according to a second standard deviation of the plurality of second sub-data;
- determining, by the processor, a second compression algorithm according to the second characteristic; and
- compressing, by the processor, the plurality of second sub-data by the second compression algorithm.

21. The data processing apparatus as claimed in claim 1, wherein the first compression algorithm and the second compression algorithm are different from each other, and the first compression algorithm is one of a dictionary compression algorithm, a shifting compression algorithm, and an incremental compression algorithm.

22. The data processing apparatus as claimed in claim 4, wherein the first compression algorithm and the second compression algorithm are different from each other, and the first compression algorithm is one of a dictionary compression algorithm, a shifting compression algorithm, and an incremental compression algorithm.

23. The data processing apparatus as claimed in claim 10, wherein the first compression algorithm and the second compression algorithm are different from each other, and the first compression algorithm is one of a dictionary compression algorithm, a shifting compression algorithm, and an incremental compression algorithm.

24. The data processing method as claimed in claim 11, wherein the first compression algorithm and the second compression algorithm are different from each other, and the first compression algorithm is one of a dictionary compression algorithm, a shifting compression algorithm, and an incremental compression algorithm.

25. The data processing method as claimed in claim 14, wherein the first compression algorithm and the second compression algorithm are different from each other, and the first compression algorithm is one of a dictionary compression algorithm, a shifting compression algorithm, and an incremental compression algorithm.

26. The data processing method as claimed in claim 20, wherein the first compression algorithm and the second compression algorithm are different from each other, and the first compression algorithm is one of a dictionary compression algorithm, a shifting compression algorithm, and an incremental compression algorithm.

* * * * *